US010191393B2

(12) United States Patent
Westerlaken et al.

(10) Patent No.: US 10,191,393 B2
(45) Date of Patent: Jan. 29, 2019

(54) LITHOGRAPHIC APPARATUS, AND DEVICE MANUFACTURING METHOD

(71) Applicant: ASML Netherlands B.V., Veldhoven (NL)

(72) Inventors: Jan Steven Christiaan Westerlaken, Heesch (NL); Marcel Koenraad Marie Baggen, Nuenen (NL); Fransiscus Mathijs Jacobs, Asten (NL); Jeroen Arnoldus Leonardus Johannes Raaymakers, Oirschot (NL); Frank Pieter Albert Van Den Berkmortel, Deurne (NL); Marc Wilhelmus Maria Van Der Wijst, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/558,552

(22) PCT Filed: Feb. 22, 2016

(86) PCT No.: PCT/EP2016/053633
§ 371 (c)(1),
(2) Date: Sep. 14, 2017

(87) PCT Pub. No.: WO2016/150631
PCT Pub. Date: Sep. 29, 2016

(65) Prior Publication Data
US 2018/0059555 A1    Mar. 1, 2018

(30) Foreign Application Priority Data

Mar. 23, 2015 (EP) .................................. 15160278

(51) Int. Cl.
*G03F 7/20* (2006.01)
*G03F 9/00* (2006.01)

(52) U.S. Cl.
CPC .......... *G03F 7/70775* (2013.01); *G03F 7/709* (2013.01); *G03F 7/7085* (2013.01);
(Continued)

(58) Field of Classification Search
CPC ............. G03F 7/70633; G03F 7/70641; G03F 7/70775; G03F 7/7085; G03F 7/70858; G03F 7/709; G03F 9/70; G03F 9/7046
(Continued)

(56) References Cited

U.S. PATENT DOCUMENTS 7,903,866 B2   3/2011  Van Der Wijst et al.
8,570,492 B2   10/2013 Van Der Pasch et al.
(Continued)

FOREIGN PATENT DOCUMENTS

EP     0844532     5/1998
EP     1037117     9/2000
(Continued)

OTHER PUBLICATIONS

International Search Report and Written Opinion dated Jun. 28, 2016 in corresponding International Patent Application No. PCT/EP2016/053633.
(Continued)

*Primary Examiner* — Colin Kreutzer
(74) *Attorney, Agent, or Firm* — Pillsbury Winthrop Shaw Pittman LLP (57) ABSTRACT

A measurement system for a lithographic apparatus includes a sub-frame compliantly mounted on a reference frame. A measurement device, e.g. an alignment sensor, is mounted on the sub-frame. Soft mounting of the sub-frame isolates the alignment sensor from high-frequency disturbances, e.g. acoustic noise, by acting as a low-pass filter with a cut-off frequency, e.g. in the range of from 100 to 200 Hz.

22 Claims, 3 Drawing Sheets

(52) U.S. Cl.
CPC ...... *G03F 7/70633* (2013.01); *G03F 7/70641* (2013.01); *G03F 7/70858* (2013.01); *G03F 9/70* (2013.01); *G03F 9/7046* (2013.01)

(58) Field of Classification Search
USPC .............................. 355/68, 72; 356/399–401
See application file for complete search history.

(56) References Cited

U.S. PATENT DOCUMENTS

| | | | |
|---|---|---|---|
| 8,976,355 B2 | 3/2015 | Van Der Sanden et al. | |
| 9,684,249 B2 | 6/2017 | Koevoets et al. | |
| 2008/0074629 A1* | 3/2008 | Groeneveld | G03F 7/70833 355/53 |
| 2008/0240501 A1 | 10/2008 | Van Der Wijst et al. | |
| 2010/0261106 A1* | 10/2010 | Kobayashi | G01B 21/045 430/30 |
| 2012/0050709 A1* | 3/2012 | Van Der Pasch | G03F 7/70775 355/67 |
| 2012/0242969 A1 | 9/2012 | Van Der Pasch et al. | |
| 2013/0230797 A1 | 9/2013 | Van Der Sanden et al. | |
| 2013/0293889 A1* | 11/2013 | Emoto | G01B 11/27 356/401 |
| 2014/0368800 A1 | 12/2014 | Koevoets et al. | |
| 2015/0168852 A1* | 6/2015 | Beerens | G03F 7/70775 355/72 |

FOREIGN PATENT DOCUMENTS

| | | |
|---|---|---|
| EP | 2593837 | 6/2014 |
| EP | 2818927 | 12/2014 |
| JP | 2009004737 | 1/2009 |
| JP | 2012191205 | 10/2012 |
| WO | 2009011356 | 1/2009 |
| WO | 2013/132064 | 9/2013 |

OTHER PUBLICATIONS

Butler, Hans, "Position Control in Lithographic Equipment", IEEE Control Systems, vol. 31, No. 5, pp. 28-47 (2011).

Castenmiller, Tom et al., "Towards Ultimate Optical Lithogaphy with NXT:1950i Dual Stage Immersion Platform", Proceedings of SPIE, vol. 7640, pp. 76401N-1-76401N-12 (2010).

* cited by examiner

LITHOGRAPHIC APPARATUS, AND DEVICE MANUFACTURING METHOD

CROSS REFERENCE TO RELATED APPLICATIONS

This application is the U.S. national phase entry of PCT patent application no. PCT/EP2016/053633, which was filed on Feb. 22, 2016, which claims priority to European patent application No. 15160278.6, filed Mar. 23, 2015.

FIELD

The present invention relates to a lithographic apparatus and a method for manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs).

SUMMARY

Device manufacturing using lithographic methods requires a large number of layers—often 30 or more—to be printed with very accurate relative positioning. Errors in the positioning of successive layers are known as overlay errors or simply overlay. Control of overlay requires, among other things, very accurate measurement of the positions of alignment markers on a substrate relative to each other and to fiducials provided on a substrate table that supports the substrate during exposure. The process of measuring the positions of alignment markers is known as alignment. To reduce overlay it is desirable to measure the positions of the alignment markers more accurately and/or to measure the position of more alignment markers.

The rate at which substrates can be exposed by a lithographic apparatus is known as throughput. It is desirable to increase throughput to reduce the cost of ownership of a lithographic apparatus. To increase throughput it is desirable to reduce the amount of time taken by alignment. Reducing the time spent on alignment implies making fewer measurements or making each measurement more quickly. Making measurements more quickly makes it harder to maintain accuracy. Accordingly, the desires to reduce overlay and to increase throughput place contradictory pressures alignment.

There are similar contradictory pressures on other measurement processes that are carried out on a substrate before and after exposure.

It is desirable, for example, to provide an improved measurement apparatus for a lithographic apparatus.

According to an aspect of the invention, there is provided a lithographic apparatus comprising: a reference frame; a substrate stage movable relative to the reference frame and configured to hold a substrate; a sub-frame coupled to the reference frame via a soft-mount; a measurement device configured to sense an attribute of a substrate; wherein the measurement device is mounted on the sub-frame and the soft-mount is configured to reduce the effect of vibrations in the reference frame on operation of the measurement device.

According to an aspect of the invention, there is provided a device manufacturing method using a lithographic apparatus, the method comprising: measuring an attribute of a substrate using a measurement device, the measurement device being mounted on a sub-frame and the sub-frame being coupled to a reference frame via a soft-mount; measuring a position of the measurement device relative to the reference frame; positioning the substrate relative to the reference frame based in part on the measurement of the attribute and the measurement of the position; and projecting a radiation beam onto the substrate to expose a radiation-sensitive layer thereof.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
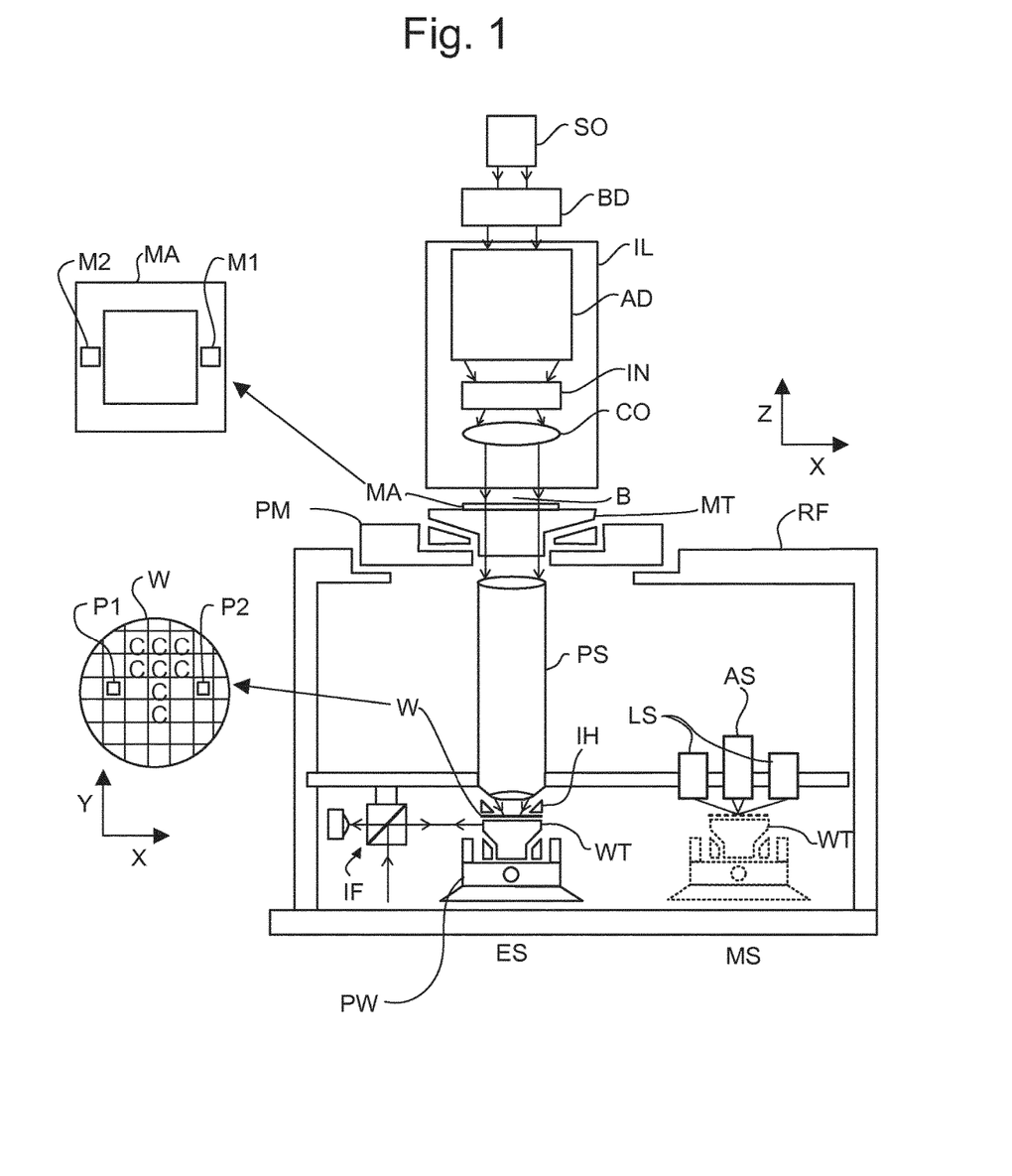
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device MA in accordance with certain parameters;
- a support table, e.g. a sensor table to support one or more sensors or a substrate table WT constructed to hold a substrate (e.g. a resist-coated substrate) W, connected to a second positioner PW configured to accurately position the surface of the table, for example of a substrate W, in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illumination system IL may include various types of optical components, such as refractive, reflective, magnetic, electromagnetic, electrostatic or other types of optical components, or any combination thereof, for directing, shaping, or controlling radiation. The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device." The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W.

With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed.

Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

A liquid can be provided between a final element of the projection system PS and the substrate, e.g. increase the effective NA of the projection system. Any suitable system for providing a liquid can be used, including bath type arrangements, so-called localized immersion systems and all-wet immersion systems.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The lithographic apparatus has two stations at which processes are performed on to the radiation-sensitive substrate: the exposure station ES and the measurement station MS. At the exposure station ES, the radiation-sensitive substrate is exposed to the patterned projection beam in order to impart a pattern to the radiation-sensitive layer thereon. The projection system PS is located at the exposure station ES. At the measurement station MS, various measurement processes are conducted on the substrate before, and sometimes also after, exposure thereof. The measurement processes are sometimes referred to as characterization and may include an alignment process in which the positions of a plurality of alignment markers provided on the substrate are measured relative to one or more fiducials provided on the substrate table. An alignment process can be carried out using an alignment sensor AS which detects the presence of an alignment marker in its field of view. The substrate is scanned through the field of view of the alignment sensor whilst displacements of the substrate are measured. Characterization of the substrate can also include measuring the substrate surface topology, e.g. using a level sensor LS.

The lithographic apparatus may be of a type having two or more tables (or stage or support), e.g., two or more substrate tables or a combination of one or more substrate tables and one or more cleaning, sensor or measurement tables. For example, in an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a substrate table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In such "multiple stage" (or "multi-stage") machines the multiple tables may be used in parallel, or preparatory steps may be carried out on one or more tables while one or more other tables are being used for exposure. The lithographic apparatus may have two or more patterning device tables (or stages or support) which may be used in parallel in a similar manner to substrate, cleaning, sensor and/or measurement tables.

Figure 2:
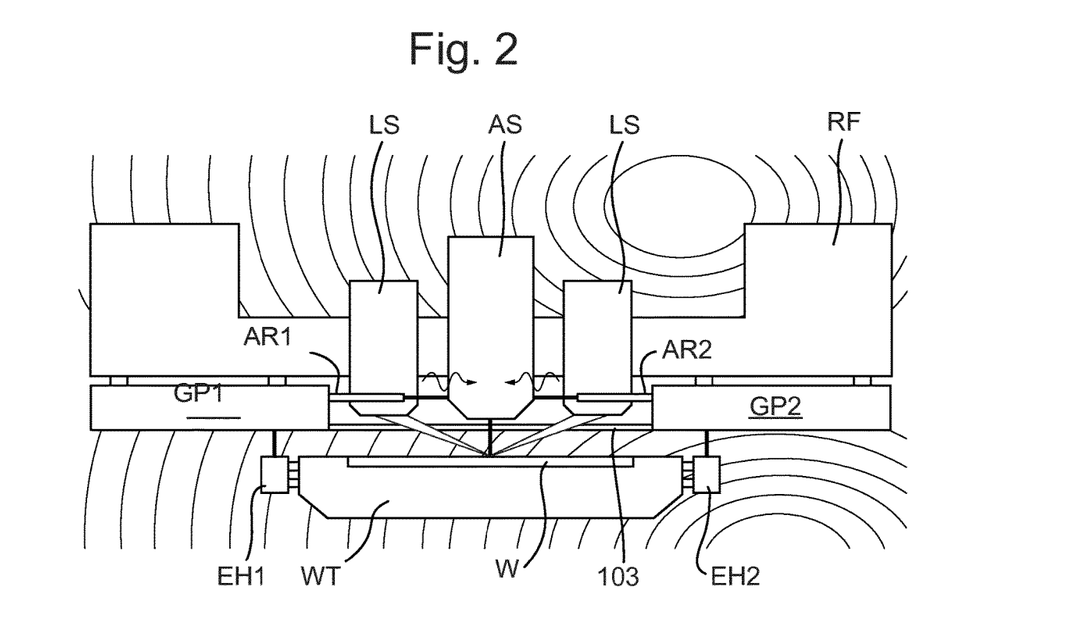
FIG. 2 depicts a measurement station in a lithographic projection apparatus described for reference.

FIG. 2 shows a measurement station of a reference lithographic apparatus. A reference frame RF, which may also be referred to as a metrology frame, supports a level sensor LS and an alignment sensor AS. The level sensor LS comprises two units. One of the units of the level sensor directs a level measurement beam at an oblique angle of incidence on to the substrate W. The level measurement beam is reflected by the substrate. The other unit of the level sensor detects the level measurement beam after reflection by the substrate. From the position of the level measurement beam after reflection by the substrate, the level sensor LS determines the vertical (z direction) position of the surface of the substrate. The alignment sensor AS emits an alignment measurement beam towards the substrate W. The alignment measurement beam is reflected by the substrate and received by the alignment sensor. The alignment sensor detects whether a marker of pre-determined form, referred to as an alignment marker, is present at a point of interest of the alignment sensor. Various different types of level sensor LS and alignment sensor AS are known and sensors of any convenient type can be used in an embodiment. By scanning the substrate W beneath the level sensor LS and alignment sensor AS whilst measuring displacements of the substrate, relative positions of alignment markers can be determined and a map of the surface topology of the substrate can be produced. The relative positions of a plurality of fiducials, which are similar in form to the alignment marks, are also measured, enabling the position of the substrate W relative to the substrate table WT to be determined.

During the scan, the position of the substrate table WT is tracked using a position measurement system. The position measurement system comprises, for example, a plurality of encoder heads EH1, EH2, mounted on the substrate table WT and a plurality of grid plates GP1, GP2, which are mounted on the reference frame RF. Various different arrangements of such a position measurement system are known and any suitable system can be used. To complete the measurement loop, alignment reference sensors AR1, AR2, are used to measure the position of the alignment sensor AS relative to the grid plates GP1, GP2 respectively.

The positions of the alignment markers and a substrate topography map generated by the above process are used to control the exposure process. Knowledge of the positions of alignment markers is used to position exposures correctly on the substrate and to minimize overlay error. The topography map enables the substrate to be positioned correctly in the plane of best focus during exposure. By improving the accuracy of the measurements of the positions of the alignment markers and/or measuring the positions of additional markers it is possible to reduce overlay, which has the potential to improve yield. However, the time taken to make additional measurements can substantially reduce throughput of the apparatus, increasing its cost of ownership. To both reduce overlay and increase throughput, a substantial reduction in the time taken to effect measurements for the characterization of a substrate prior to exposure is desirable.

The present inventors have discovered that a factor preventing reduction in the time taken to effect, for example, an alignment measurement, is high frequency disturbances impinging on a sensor, for example the alignment sensor AS. Such disturbances may include acoustic noise, vibrations, and temperature fluctuations. Acoustic noise may impinge directly on the sensor or be transmitted through the reference frame RF to which the sensor is attached. One source of acoustic noise within the lithographic apparatus is moving components such as the substrate table WT and the support structure MT. In a known system, the measurement of the position of an alignment marker takes a few ms. This means that disturbances of frequency higher than 100 or 200 Hertz are averaged out during the measurement process and can be neglected. However, if the time taken to make the position measurement is substantially reduced, the measurement will become sensitive to disturbances of higher frequencies.

According to an embodiment, a lithographic apparatus comprises a measurement device, for example an alignment sensor or a level sensor, mounted on a sub-frame which is in turn compliantly mounted, using a soft mount, to the reference frame. The reference frame can be mounted on isolation mounts that reduce transmission of vibrations to the reference frame. The reference frame can provide a reference target for a measurement. The reference target may be, for example, a grid plate for a position measurement system that uses encoder heads, also known as readheads, mounted on an object to detect movement of the object relative to the grid plate. The sub-frame is mounted to the reference frame via a soft-mount which reduces transmission of vibrations, e.g. high frequency vibrations, that affect the operation of the measurement device from the reference frame to the sub-frame. The soft-mount can act as a low pass filter. Desirably the soft-mount substantially prevents transmission to the sub-frame of vibrations having a frequency higher than a pre-determined cut-off frequency, the pre-determined cut-off frequency being desirably in the range of from about 100 to about 200 Hertz.

By reducing the transmission of high frequency vibrations to the measurement device, the measurement system can be operated so as to perform measurements in a short period of time without high frequency vibrations detrimentally affecting the measurements. Vibrations that an embodiment can reduce include vibrations deriving from acoustic noise. An embodiment can also reduce transmission of thermal disturbances. An embodiment can allow measurements to be taken about two orders of magnitude faster than a case where the measurement device is directly mounted to the reference frame. In an embodiment, the measurement device can make measurements at a faster rate than the predetermined cut-off frequency.

Particular advantage can be achieved in an embodiment in which the reference target on the reference frame comprises one or more grid plates for use in a position measurement system. If, for example, the position measurement system is for measuring the position and/or displacements of the substrate table, the grid plates must cover an area at least as large as the range of movement of the substrate table. The total area of the grid plates may be several times the range of the substrate table so that rotations of the substrate table, as well as displacements, can be measured. A grid plate with a large area can act as a microphone, picking up acoustic vibrations and transmitting them into the reference frame. Acoustic vibrations, or noise, can arise in a lithographic apparatus due to the moving components and airflows therein. Moving components and various purge gas flows can generate broad spectrum acoustic noise extending up to tens of kilohertz.

In an embodiment, the soft-mount can comprise a passive device such as an elastic element in combination with a damper. The elastic element can be a spring. The damper can be a fluid damper or an eddy-current damper. Rubber blocks can also be used. In an embodiment, the soft-mount can comprise an active device, including an actuator and a control system. The actuator can be a Lorentz actuator or a piezoelectric actuator. If an active amount is used, a gravity compensator employing permanent magnets can also be used.

In an embodiment, the sub-frame is constructed from a material having a desirable property, for example high rigidity, high thermal mass, low coefficient of thermal expansion and/or high thermal conductivity. Suitable materials for constructions of the sub-frame include aluminum—including rapidly solidified aluminum—SiSiC, cordierite and glass-ceramics. Since the sub-frame is relatively small, these materials can be suitable whereas they would not have suitable mechanical properties for the construction of a relatively large reference frame.

In an embodiment, a sub-frame position sensor is provided to measure the position and/or displacements of the sub-frame relative to the reference frame. In an embodiment the measurement device is used to make a measurement on a moveable object, for example a substrate table. The position of the moveable object is measured relative to the reference target. The sub-frame position thus closes a measurement loop from moveable object to reference target to sub-frame to moveable object.

Desirably, the sub-frame position sensor is configured to measure the position and/or displacements of the sub-frame relative to the reference target in at least six degrees of freedom, desirably eight degrees of freedom. By providing a sensor to measure the sub-frame in all degrees of freedom, and optionally with extra degrees of freedom to measure deformation of the sub-frame, it is possible to ensure that the movement of the point of interest of the measurement device can be calculated, even where the point of interest is displaced a significant distance from the sub-frame.

In an embodiment, the measurement device is itself compliantly mounted on the sub-frame via a sensor soft-mount. The sensor soft-mount reduces transmission of high-frequency disturbances from the sub-frame to the measurement device. Active and passive soft-mounts as described above can also be used as the sensor soft-mount.

According to an embodiment, a sensor-position measurement sensor is provided to measure the position and/or displacements of the measurement device relative to the sub-frame. In an embodiment, the measurement device mounted on the sub-frame is used to make a measurement of a moveable object whose position is measured relative to the reference target. The sensor-position measurement sensor thereby closes a measurement loop from moveable object to reference target to sub-frame to measurement device to object.

In an embodiment, the measurement device is an alignment sensor device configured to detect the presence of an alignment marker at a point of interest in its field of view. The alignment process, which is part of substrate characterization, is performed using the alignment sensor. By allowing alignment measurements to be performed at higher speed whilst still maintaining accuracy, the present invention can significantly improve overlay whilst maintaining or improving throughput.

In an embodiment, a second measurement device is mounted on the sub-frame a second sub-frame. Desirably, the second measurement device is a level sensor LS for measuring the position and/or tilt of a surface of an object, for example the substrate W. By mounting the level sensor on the same sub-frame as the alignment sensor, it can be ensured that a substrate topography map is fully consistent with the measurement of positions of alignment markers.

In an embodiment, a first temperature conditioning system is provided to maintain the reference frame at a substantially constant temperature over a first time period and a second temperature conditioning system is configured to maintain the sub-frame at a substantially constant temperature over a second time period, the second time period being shorter than the first time period.

Thus, an embodiment allows temperature conditioning of the reference frame and the sub-frame to be separately optimized to the respective requirements thereof. In particular, it is desirable that the reference frame has a stable temperature over a relatively long time period due to the presence of the grid plates which form a fundamental positional reference for the apparatus. However, it is desirable that the sub-frame has temperature stability over a shorter period, for example of the order of the time taken for the alignment process.

In an embodiment, a compartment is provided around the sub-frame and the measurement device, the compartment being configured to shield the sub-frame and the measurement device from acoustic and/or thermal disturbances. A part of the reference frame on which the reference target is provided is outside the compartment. The provision of the compartment enables the maintenance of a more stable mini-environment in the vicinity of the measurement device. In particular, a gas supply device can be provided to supply a gas to an interior of the compartment at an over-pressure, i.e. at a pressure higher than a pressure of a gas in contact with an exterior of the compartment. The gas supply to the interior of the compartment can be temperature conditioned to a higher precision than the gas that is in the exterior of the compartment in order to improve temperature stability of the measurement device. By providing the temperature conditioned gas to the interior of the compartment at an over-pressure, the ingress of relatively unconditioned gas is prevented.

An embodiment is a lithographic apparatus of the type having an exposure station which a substrate is exposed to a patterned beam of radiation and a measurement station separate from the exposure station at which measurements of the substrate are made. This type of lithographic apparatus can be referred to as a dual stage lithographic apparatus. A measurement device as described above is provided at the measurement station.

An embodiment provides a device manufacturing method using a lithographic apparatus. The method comprises measuring an attribute of a substrate using a measurement device, the measurement device is mounted on a sub-frame and the sub-frame is coupled to a reference frame via a soft mount; measuring a position of the measurement device relative to the reference frame; positioning the substrate relative to the reference frame based in part on the measurement of the attribute and the measurement of the position; and projecting a radiation beam onto the substrate to expose a radiation-sensitive layer thereof.

Figure 3:
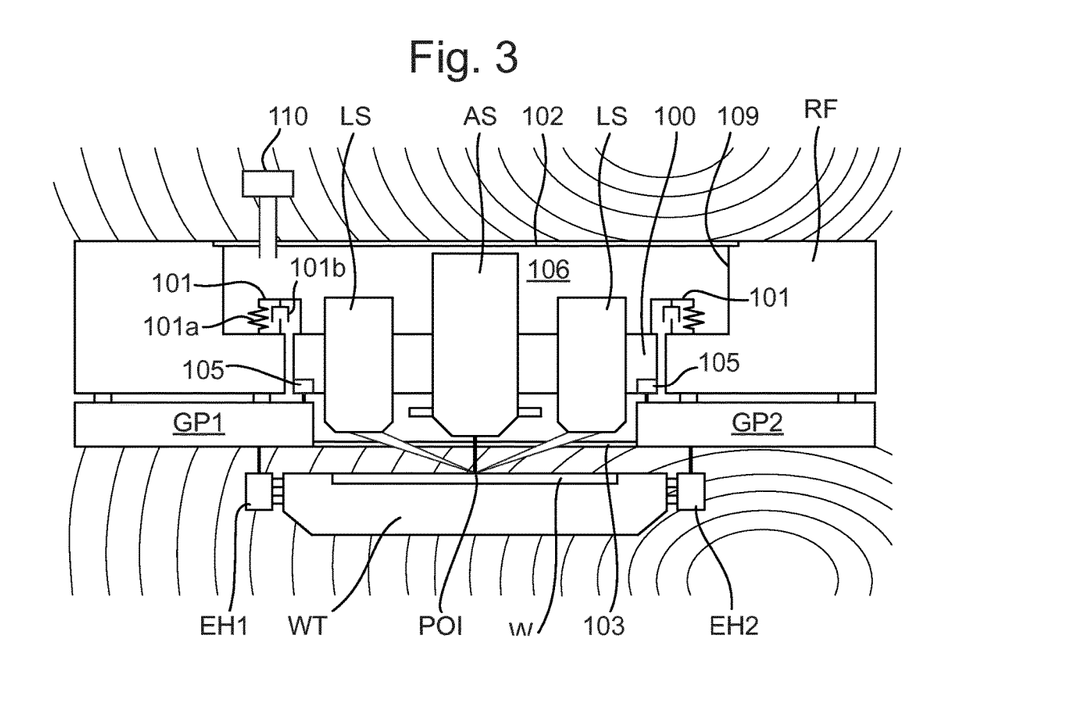
FIG. 3 depicts a measurement station in a lithographic projection apparatus according to an embodiment.

FIG. 3 depicts schematically a part of a measurement station MS of a lithographic apparatus according to an embodiment. Alignment sensor AS and level sensor LS are mounted on a sub-frame 100. Sub-frame 100 is mounted to reference frame RF by at least one soft-mount 101. Soft-mount 101 can be a passive mount, for example the soft-mount may comprise an elastic member 101a and a damper 101b. Elastic member 101a may be, for example, a spring or block of compliant material, e.g. rubber. Damper 101b may be, for example, a fluid damper or an eddy current damper. An eddy current damper comprises one or more permanent magnets and one or more conductive plates provided in the magnetic field generated by the permanent magnets. Relative movement of the conductive plate and permanent magnets generates eddy currents in the conductive plate which in turn generate magnetic fields. The magnetic fields generated by the eddy currents interact with the magnetic fields generated by the permanent magnets to resist the relative movements. Thereby a damping force is generated.

In an embodiment, the number of soft-mounts 101 as well as a spring constant and a damping coefficient of each soft-mount 101 are selected to provide a desired damping effect. In an embodiment, the or each soft-mount is configured to act as a low-pass filter, suppressing (i.e. reducing) transmission of disturbances above a pre-determined cut-off frequency to the sub-frame. The pre-determined cut-off frequency is desirably in the range of from 100 Hertz to 200 Hertz. The spring constant and damping coefficient as well as the number of soft-mounts required to achieve this effect will depend on the mass of the sub-frame and the components supported thereby.

In an embodiment, one or more of the soft-mounts 101 is an active mount. An active mount may comprise an actuator, e.g. a Lorentz actuator or a piezo-electric actuator, and a control system.

In an embodiment, sub-frame 100 is constructed to be stiff, i.e. have a high rigidity. Sub-frame 100 desirably has a lowest eigenfrequency greater than about 700 Hertz. Sub-frame 100 desirably also has a large thermal mass to dampen the effect of any thermal disturbances. The sub-frame is desirably made of a material having a low coefficient of thermal expansion and desirably a high thermal conductivity. Suitable materials from which sub-frame 100 can be constructed include aluminum, rapidly solidified aluminum, SiSiC, cordierite and glass ceramics.

In an embodiment of the invention, one or more sub-frame position sensors 105 are mounted on sub-frame 100. The sub-frame position sensor 105, or each sub-frame position sensor 105 where there are multiple such sensors, is configured to measure the position of sub-frame 100 relative to a reference target (for example a grid plate GP1) provided on reference frame RF. The reference target is used by another measurement system (e.g. a position measurement system for the substrate table WT) as a reference point. Desirably, each sub-frame position sensor 105, or all of the sub-frame position sensors 105, measures the position of the sub-frame in at least six degrees of freedom, desirably eight degrees of freedom. This enables the exact position of the point of interest of the alignment sensor AS to be calculated relative to the reference target even if the sub-frame position sensor(s) 105 are located a significant distance away from the point of interest and takes account of deformation of the sub-frame. Because of the distance between the point of interest POI of the alignment sensor AS and the sub-frame position sensor(s) 105, Abbe error in the calculated position of the point of interest POI can arise if the sub-frame is tilted relative to the reference frame RF or deformed. The Abbe error can be corrected for by measurement of the position of the sub-frame in sufficient degrees of freedom. Desirably, the arrangement of sub-frame position sensor(s) 105 is symmetric so that the overall system is insensitive for symmetric deformations. The sub-frame position sensor(s) can comprise one or more encoders and one or more grid plates and/or one or more capacitive sensors.

Sub-frame 100, alignment sensor AS and level sensor LS form an integrated measurement module. The integrated measurement module can be constructed so as to be stiffer than if the alignment sensor AS and level sensor LS are separately mounted to a reference frame. The measurement module can be calibrated and the alignment sensor AS and level sensor LS aligned to each other outside the lithographic apparatus to make servicing and upgrading the lithographic apparatus easier.

As shown in FIG. 3, sub-frame 100 is disposed within a recess 109 provided in reference frame RF. Compartment walls 102, 103 are provided to form an enclosed compartment 106. Compartment walls 102, 103 are configured to shield the sub-frame 100 and the measurement devices (for example alignment sensor AS and level sensor LS) mounted to it from disturbances, in particular acoustic noise in the surrounding environment and thermal disturbances due to temperature variations in the air or gas in the apparatus.

A gas supply 110 is provided to supply temperature-conditioned gas to the interior of compartment 106. The temperature-conditioned gas supplied by gas supply 108 has its temperature controlled so that it varies by less than a pre-determined amount, e.g. 25 mK, over a pre-determined time scale, e.g. 20 ms. Desirably gas supply 110 supplies temperature-conditioned gas to compartment 106 at an over-pressure, i.e. at a higher pressure than ambient gas outside the compartment 106 and contacting the compartment walls 102, 103. By supplying temperature-conditioned gas to the compartment 106 at an over-pressure, it can be ensured that ambient gas from outside the compartment, which may be at a less stable temperature than desired, does not leak into the compartment 106.

The exact form of compartment 106 will depend on the arrangement of sub-frame 100 relative to reference frame RF. For example if sub-frame 100 is mounted on a surface of reference frame RF so as to project therefrom, compartment walls 102, 103 could be provided in the shape of a box surrounding sub-frame 100 and the measurement devices mounted thereon. In the illustrated embodiment, compartment wall 103 is provided substantially flush with the lower surface of grid plates GP1, GP2.

Compartment walls 102, 103 can be provided with windows or apertures as desired to enable a measurement beam, such as the level measurement beam and/or the alignment measurement beam, and/or utility conduits to be passed into and out of compartment 106. In particular, in the illustrated configuration, compartment wall 103 is provided with a plurality of apertures to allow the level measurement beam from the level sensor LS and the alignment measurement beam from the alignment sensor AS to be directed to the point of interest POI and to allow the reflected level measurement beam and the reflected alignment measurement beam to be received therefrom.

Figure 4:
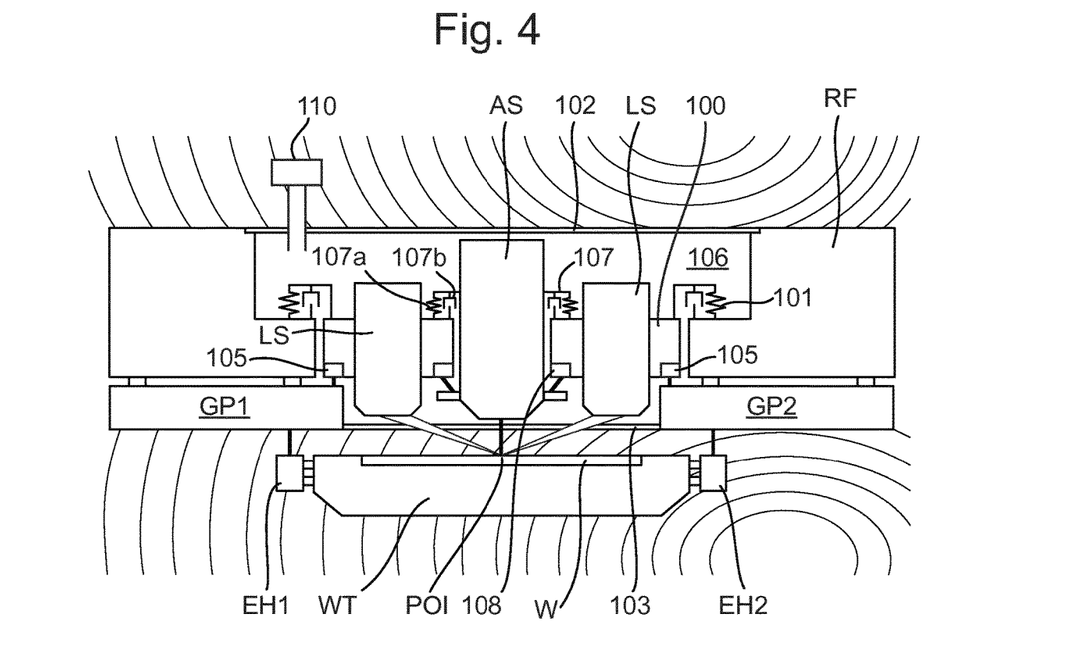
FIG. 4 depicts a measurement station in a lithographic projection apparatus according to another embodiment.

A measurement stage of a lithographic apparatus according to another embodiment is illustrated in FIG. 4. Elements of the apparatus shown in FIG. 4 that are the same as or similar to elements of the apparatus of FIG. 3 are indicated with the same reference numbers and will not be described further below. In the apparatus of FIG. 4, alignment sensor AS is mounted to the sub-frame 100 via one or more sensor soft-mounts 107. Sensor Soft-mount(s) 107 can be a passive mount or an active mount similarly to soft-mount(s) 101. For example, sensor soft-mount 107 may comprise an elastic element 107a and a damper 107b. The apparatus of FIG. 4 also includes one or more sensor-position measurement sensors 108 which measure the position and/or displacements of the alignment sensor AS relative to the sub-frame 100.

The arrangement of FIG. 4 provides two levels of isolation for the alignment sensor, with the mass of the sub-frame 100 additionally acting as a damper to reduce the transmission of high frequency vibrations to the alignment sensor. In an embodiment, an additional reduction of the transmission of vibrations and other disturbances by a factor of three can be achieved with the arrangement of FIG. 4 compared to the arrangement of FIG. 3.

The sensor-position measurement sensor(s) 108 desirably measures relevant rigid body movements of the alignment sensor AS relative to the sub-frame 100. The sensor-position measurement sensor 108, or all sensor-position measurement sensors 108 together, desirably measure at least three degrees of freedom of movement of the alignment sensor, more desirably four degrees of freedom. Similarly to sub-frame position sensor(s) 105, sensor-position measurement sensor(s) 108 can be arranged to eliminate Abbe error in the determination of the position of the point of interest POI. Again, desirably a plurality of sensor-position measurement sensors 108 is arranged symmetrically around alignment sensor AS to make the arrangement insensitive to symmetric deformation.

The above-described arrangements for measuring the position of the sub-frame relative to the reference target and, in the arrangement of FIG. 4, the alignment sensor relative to the sub-frame, can enable the sub-frame position sensors 105 and the sensor-position measurement sensors to be arranged in a smaller volume than an arrangement which directly measures the position of the alignment sensor relative to the reference target or reference frame. The sub-frame position sensors 105 and sensor-position measurement sensors 108 in an embodiment of the invention need only measure across short distances compared to sensors that measure directly between the alignment sensor AS and grid plates GP1, GP2. Thus, valuable space is freed up in the apparatus.

In an embodiment, there is provided a lithographic apparatus comprising: a reference frame; a substrate stage movable relative to the reference frame and configured to hold a substrate; a sub-frame coupled to the reference frame via a soft-mount; and a measurement device configured to sense an attribute of a substrate, wherein the measurement device is mounted on the sub-frame and the soft-mount is configured to reduce the effect of vibrations in the reference frame on operation of the measurement device.

In an embodiment, the lithographic apparatus further comprises a sub-frame position sensor configured to measure the position of the sub-frame relative to the reference frame. In an embodiment, the lithographic apparatus further comprises a sensor soft-mount configured to mount the measurement device on the sub-frame and reduce transmission of high-frequency disturbances from the sub-frame to the measurement device. In an embodiment, the lithographic apparatus further comprises a position determining system for determining a position of the measurement device relative to the sub-frame. In an embodiment, the lithographic apparatus further comprises a position determining system for determining a position of the measurement device relative to the reference frame. In an embodiment, the soft-mount is configured to substantially prevent transmission to the sub-frame of vibrations having a frequency higher than a predetermined cut-off frequency, the predetermined cut-off frequency being desirably in the range of from about 100 to 200 Hz. In an embodiment, the measurement device is one of an alignment sensor configured to detect the presence of an alignment marker at a point of interest and a level sensor for measuring the position and/or tilt of a surface of an object. In an embodiment, the second measurement device is one of an alignment sensor configured to detect the presence of an alignment marker at a point of interest and a level sensor for measuring the position and/or tilt of a surface of an object. In an embodiment, the lithographic apparatus further comprises a first temperature conditioning system configured to maintain the reference frame at a substantially constant temperature over a first time period; and a second temperature conditioning system configured to maintain the sub-frame at a substantially constant temperature over a second time period, the second time period being shorter than the first time period. In an embodiment, the lithographic apparatus further comprises a compartment around the sub-frame and the measurement device, the compartment being configured to shield the sub-frame and the measurement device from acoustic and/or thermal disturbances, wherein a part of the reference frame on which a reference is provided is outside the compartment. In an embodiment, the lithographic apparatus further comprises a gas supply device configured to supply a gas to an interior of the compartment at a pressure higher than a pressure of a gas in contact with an outside of the compartment. In an embodiment, the lithographic apparatus is of the type having an exposure station at which a substrate is exposed to a patterned beam of radiation and a measurement station separate from the exposure station at which measurements of the substrate are made, wherein the measurement device is located at the measurement station.

In an embodiment, there is provided a device manufacturing method using a lithographic apparatus, the method comprising: measuring an attribute of a substrate using a measurement device, the measurement device being mounted on a sub-frame and the sub-frame being coupled to a reference frame via a soft-mount; measuring a position of the measurement device relative to the reference frame; positioning the substrate relative to the reference frame based in part on the measurement of the attribute and the measurement of the position; and projecting a radiation beam onto the substrate to expose a radiation-sensitive layer thereof.

As will be appreciated, any of the above described features can be used with any other feature and it is not only those combinations explicitly described which are covered in this application.

Furthermore, although the invention has been described above in the context of an immersion lithographic apparatus for convenience, it will be appreciated that the invention may be used in conjunction with any form of lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm) and EUV (e.g. having a wavelength in the range of from about 5 to about 20 nm). The term "lens", where the context allows, may refer to any one or combination of various types of optical components, including refractive and reflective optical components.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   a reference frame;
   a substrate stage movable relative to the reference frame and configured to hold a substrate;
   a sub-frame coupled to the reference frame via a soft-mount;
   a measurement device configured to sense an attribute of a substrate,
   wherein the measurement device is mounted on the sub-frame and the soft-mount is configured to reduce the effect of vibrations in the reference frame on operation of the measurement device;
   a sensor soft-mount configured to mount the measurement device on the sub-frame and reduce transmission of disturbances having a frequency higher than 100 Hz from the sub-frame to the measurement device; and
   a position determining system configured to determine a position of the measurement device relative to the sub-frame.

2. A lithographic apparatus according to claim 1, further comprising a sub-frame position sensor configured to measure the position of the sub-frame relative to the reference frame.

3. A lithographic apparatus according to claim 1, further comprising a position determining system for determining a position of the measurement device relative to the reference frame.

4. A lithographic apparatus according to claim 1, wherein the soft-mount is configured to substantially prevent transmission to the sub-frame of vibrations having a frequency higher than a predetermined cut-off frequency.

5. A lithographic apparatus according to claim 1, wherein the measurement device is an alignment sensor configured to detect the presence of an alignment marker at a point of interest or a level sensor for measuring the position and/or tilt of a surface of an object.

6. A lithographic apparatus according to claim 1, further comprising:
   a first temperature conditioning system configured to maintain the reference frame at a substantially constant temperature over a first time period; and
   a second temperature conditioning system configured to maintain the sub-frame at a substantially constant temperature over a second time period, the second time period being shorter than the first time period.

7. A lithographic apparatus according to claim 1, further comprising a compartment around the sub-frame and the measurement device, the compartment configured to shield the sub-frame and the measurement device from acoustic and/or thermal disturbances, wherein a part of the reference frame on which a reference is provided is outside the compartment.

8. A lithographic apparatus according to claim 7, further comprising a gas supply device configured to supply a gas to an interior of the compartment at a pressure higher than a pressure of a gas in contact with an outside of the compartment.

9. A lithographic apparatus according to claim 1 of the type having an exposure station at which a substrate is exposed to a patterned beam of radiation and a measurement station separate from the exposure station at which measurements of the substrate are made, wherein the measurement device is located at the measurement station.

10. A device manufacturing method using a lithographic apparatus, the method comprising:
    measuring an attribute of a substrate using a measurement device, the measurement device mounted on a sub-frame and the sub-frame coupled to a reference frame via a soft-mount;
    determining a position of the measurement device relative to the reference frame using a measurement;
    determining a position of the substrate or a substrate stage holding the substrate, relative to the reference frame using a measurement;
    positioning the substrate relative to the reference frame based in part on the measurement of the attribute, the determined position of the measurement device, and the determined position of the substrate or substrate stage; and
    projecting a radiation beam onto the substrate to expose a radiation-sensitive layer thereof.

11. A method according to claim 10, further comprising measuring the position of the sub-frame relative to the reference frame using a sub-frame position sensor.

12. A method according to claim 10, further comprising the measurement device being mounted on the sub-frame by a sensor soft-mount configured to reduce transmission of high-frequency disturbances from the sub-frame to the measurement device.

13. A method according to claim 12, further comprising determining a position of the measurement device relative to the sub-frame using a position determining system.

14. A method according to claim 10, wherein the soft-mount is configured to substantially prevent transmission to the sub-frame of vibrations having a frequency higher than a predetermined cut-off frequency, the predetermined cut-off frequency being selected from the range of from about 100 to 200 Hz.

15. A method according to claim 10, wherein the measurement device is an alignment sensor configured to detect the presence of an alignment marker at a point of interest or a level sensor configured to measure the position and/or tilt of a surface of an object.

16. A method according to claim 10, further comprising:
    maintaining the reference frame at a substantially constant temperature over a first time period; and
    maintaining the sub-frame at a substantially constant temperature over a second time period, the second time period being shorter than the first time period.

17. A method according to claim 10, further comprising shielding the sub-frame and the measurement device from acoustic and/or thermal disturbances by a compartment around the sub-frame and the measurement device, wherein a part of the reference frame on which a reference is provided is outside the compartment.

18. A method according to claim 17, further comprising supplying a gas to an interior of the compartment at a pressure higher than a pressure of a gas in contact with an outside of the compartment.

19. A method according to claim 10, wherein the method is performed using a lithographic apparatus of the type having an exposure station at which a substrate is exposed to the radiation beam and a measurement station separate from the exposure station at which measurements of the substrate are made, wherein the measurement device is located at the measurement station.

20. A lithographic apparatus comprising:
   a reference frame;
   a substrate stage movable relative to the reference frame, the substrate configured to hold a substrate for exposure to a projected radiation beam;
   a sub-frame coupled to the reference frame via a soft-mount;
   a measurement device configured to sense an attribute of a substrate, the measurement device mounted on the sub-frame and the measurement device being an alignment sensor configured to detect the presence of an alignment marker at a point of interest or a level sensor configured to measure the position and/or tilt of a surface of an object;
   a position determining system configured to determine a position of the measurement device relative to the reference frame using a measurement; and
   a control system configured to cause positioning of the substrate relative to the reference frame based in part on the measurement of the attribute and the measurement of the position.

21. A lithographic apparatus of claim 20, wherein the soft-mount is configured to reduce the effect of vibrations in the reference frame on operation of the measurement device and further comprising a sensor soft-mount configured to mount the measurement device on the sub-frame and to reduce transmission of disturbances having a frequency higher than 100 Hz from the sub-frame to the measurement device.

22. A lithographic apparatus of claim 20, further comprising a position determining system configured to determine a position of the substrate or substrate stage relative to the reference frame using a measurement and wherein the control system is configured to cause positioning of the substrate relative to the reference frame based in part on the measurement of the attribute, the determination of the position of the measurement device, and determination of the position of the substrate or substrate stage.

* * * * *